(12) United States Patent
Wang et al.

(10) Patent No.: US 12,169,304 B2
(45) Date of Patent: Dec. 17, 2024

(54) SUBSTRATE COUPLED GRATING COUPLERS IN PHOTONIC INTEGRATED CIRCUITS

(71) Applicant: Google LLC, Mountain View, CA (US)

(72) Inventors: Liming Wang, San Jose, CA (US); Ryohei Urata, San Carlos, CA (US); Jan Petykiewicz, Palo Alto, CA (US); Jill Berger, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/203,328

(22) Filed: May 30, 2023

(65) Prior Publication Data

US 2023/0314709 A1    Oct. 5, 2023

Related U.S. Application Data

(62) Division of application No. 17/036,827, filed on Sep. 29, 2020, now Pat. No. 11,726,260.

(51) Int. Cl.

| G02B 6/12 | (2006.01) |
| G02B 6/122 | (2006.01) |
| G02B 6/124 | (2006.01) |
| G02B 6/13 | (2006.01) |
| H01L 23/00 | (2006.01) |

(52) U.S. Cl.
CPC .......... *G02B 6/124* (2013.01); *G02B 6/1228* (2013.01); *G02B 6/13* (2013.01); *H01L 24/16* (2013.01); *G02B 2006/12107* (2013.01); *H01L 2224/16225* (2013.01)

(58) Field of Classification Search
CPC .................................... G02B 6/12; G02B 6/13

USPC ........................................................... 385/37
See application file for complete search history.

(56) References Cited

U.S. PATENT DOCUMENTS

| 7,058,261 B2 * | 6/2006 | Ghiron ...................... G02B 6/34 |
| | | 385/36 |
| 7,194,016 B2 * | 3/2007 | Bullington ........... G02B 6/4214 |
| | | 372/108 |
| 8,855,452 B2 * | 10/2014 | Andry .................. G02B 6/4204 |
| | | 385/33 |
| 9,028,157 B2 * | 5/2015 | Na ........................... G02B 6/12 |
| | | 385/37 |

(Continued)

FOREIGN PATENT DOCUMENTS

| CN | 1115033 A | 1/1996 |
| CN | 104390694 A | 3/2015 |

(Continued)

OTHER PUBLICATIONS

Zhang et al. Simulation research of high-efficiency unidirectional vertical coupling grating couplers for optical through-silicon vias in 3D optoelectronic integrated circuits. Aug. 28, 2020. Optics Communications, Elsevier, Amsterdam, NL, vol. 479, XP086313328, DOI: 10.1016/J.OPTCOM.2020.126408. 5 pages.

(Continued)

*Primary Examiner* — Kaveh C Kianni
(74) *Attorney, Agent, or Firm* — Lerner David LLP

(57) ABSTRACT

A photonic integrated circuit chip includes a substrate and a wafer on the substrate. The wafer itself includes a photonic grating coupler with a taper portion and grating features. The grating features extend from the taper portion toward the substrate.

12 Claims, 11 Drawing Sheets

(56) References Cited

U.S. PATENT DOCUMENTS

| | | | |
|---|---|---|---|
| 9,285,554 B2* | 3/2016 | Doany | G02B 6/32 |
| 9,612,401 B2* | 4/2017 | Frankel | G02B 6/4206 |
| 10,216,061 B2* | 2/2019 | Popovich | H01L 27/14625 |
| 10,725,244 B2* | 7/2020 | Paquet | G02B 6/124 |
| 11,143,821 B1* | 10/2021 | Kojima | G02B 6/124 |
| 11,536,897 B1* | 12/2022 | Thompson | G02B 6/4243 |
| 11,927,806 B2* | 3/2024 | Kuo | G02B 6/34 |
| 2002/0039464 A1* | 4/2002 | Yoshimura | H01L 24/24 257/E25.032 |
| 2002/0097962 A1* | 7/2002 | Yoshimura | G02B 6/124 385/16 |
| 2003/0034538 A1* | 2/2003 | Brophy | H01S 5/4031 257/E21.12 |
| 2003/0081878 A1* | 5/2003 | Joyner | H01S 5/4031 385/14 |
| 2004/0033004 A1* | 2/2004 | Welch | H04B 10/2914 385/14 |
| 2004/0069984 A1* | 4/2004 | Estes | B82Y 20/00 257/E23.01 |
| 2010/0001114 A1 | 5/2010 | Pinguet et al. | |
| 2010/0111473 A1* | 5/2010 | Pinguet | G02B 6/34 385/37 |
| 2011/0150386 A1* | 6/2011 | Dupuis | G02B 6/10 264/1.24 |
| 2013/0279844 A1* | 10/2013 | Na | G02B 6/124 438/27 |
| 2014/0010498 A1* | 1/2014 | Verslegers | G02B 6/26 385/37 |
| 2014/0193115 A1* | 7/2014 | Popovic | G02B 6/124 385/14 |
| 2015/0205062 A1* | 7/2015 | Collins | G02B 6/34 385/14 |
| 2015/0260913 A1* | 9/2015 | Li | G02B 6/124 385/14 |
| 2015/0309261 A1* | 10/2015 | Kobyakov | G02B 6/124 385/14 |
| 2016/0062063 A1* | 3/2016 | Ogura | G02B 6/305 264/1.27 |
| 2016/0124164 A1* | 5/2016 | Doerr | G02B 6/428 385/14 |
| 2016/0246009 A1* | 8/2016 | Jiang | G02B 6/124 |
| 2016/0315452 A1* | 10/2016 | Chen | H01S 5/1032 |
| 2016/0363728 A1* | 12/2016 | Wang | G01N 21/6486 |
| 2017/0179680 A1* | 6/2017 | Mahgerefteh | H01S 5/12 |
| 2017/0186670 A1* | 6/2017 | Budd | H01L 25/167 |
| 2017/0207600 A1* | 7/2017 | Klamkin | H01S 5/142 |
| 2018/0081118 A1* | 3/2018 | Klamkin | H01S 5/1035 |
| 2019/0207362 A1* | 7/2019 | Kong | G02B 6/34 |
| 2020/0003956 A1* | 1/2020 | Kuo | G02B 6/124 |
| 2020/0081204 A1* | 3/2020 | Mahgerefteh | G02B 6/12002 |
| 2020/0174194 A1* | 6/2020 | Kojima | G02B 6/124 |
| 2020/0241205 A1* | 7/2020 | Kojima | H01S 5/142 |
| 2020/0278508 A1* | 9/2020 | Israel | G02B 6/423 |
| 2021/0116645 A1* | 4/2021 | Kojima | G02B 6/124 |
| 2021/0255397 A1* | 8/2021 | Hao | G02B 6/124 |
| 2021/0341691 A1* | 11/2021 | Sutherland | G02B 6/3616 |
| 2022/0311206 A1* | 9/2022 | Clayton | H01S 5/0287 |
| 2023/0084003 A1* | 3/2023 | Taha | G02B 6/4214 385/31 |

FOREIGN PATENT DOCUMENTS

| | | | |
|---|---|---|---|
| CN | 106873076 A | 6/2017 | |
| WO | WO-2010100738 A1 * | 9/2010 | H01S 5/02248 |
| WO | 2013089755 A1 | 6/2013 | |
| WO | 2016201387 A1 | 12/2016 | |

OTHER PUBLICATIONS

Extended European Search Report for European Patent Application No. 21156137.8 dated Jul. 6, 2021. 9 pages.

First Office Action for Chinese Patent Application No. 202011617724.2 dated Jun. 16, 2022. 11 pages.

Office Action for Chinese Patent Application No. 202011617724.2 dated Dec. 21, 2022. 8 pages.

Office Action for European Patent Application No. 21156137.8 dated May 6, 2024. 9 pages.

* cited by examiner

SUBSTRATE COUPLED GRATING COUPLERS IN PHOTONIC INTEGRATED CIRCUITS

CROSS-REFERENCE TO RELATED APPLICATIONS

This application is a divisional of U.S. application Ser. No. 17/036,827, filed on Sep. 29, 2020, the disclosure of which is incorporated herein by reference.

BACKGROUND

Known photonic integrated circuits (PICs) are provided in the form of a chip including a thick substrate layer. The substrate layer is necessary to provide the chip with enough structural integrity for its intended purpose. A wafer defining the function of the PIC is typically deposited on top of the substrate. The wafer side of a PIC chip is conventionally referred to as the top side because the wafer is at the top according to the direction in which layers of the chip are stacked. Similarly, the terms "up" and "down" with reference to PIC chip architecture are conventionally used to describe increasing and decreasing proximity, respectively, to an outward facing surface of the wafer, regardless of the actual orientation of the chip.

Photonic signals, such as those carried by fiber-optic cables, are communicated into or out of a PIC with a coupler. Multiple types of couplers exist, but grating couplers are commonly used to send or receive the photonic signals at an angle transverse to the plane of the wafer. A typical grating coupler includes a horn provided by a portion of waveguide material that defines a generally triangular shape on a plane parallel to that of the wafer. The horn is sometimes referred to as a taper portion, because it tapers from a wide end down to a relatively narrow point of connection with a waveguide of the PIC. Grating in the form of uneven features on a side of the taper portion facing a cladding layer of the chip direct a photonic signal either into or out of the plane of the taper portion.

In applications where a PIC with a grating coupler communicates with an electrical printed circuit board (PCB), the PIC is placed substrate side down on the PCB. Electrical contact pads are patterned on the functional layers of the PIC opposite from the substrate and wirebonded to the PCB. The PIC converts photonic signals to or from electrical signals communicated through the bond wires. The inductance of a wire increases as a function of its length, so the frequency response of communication between the PIC and PCB is limited by the length of the bond wires. Because the wirebonds extend to the PCB from an opposite side of the PIC, the length of the wirebonds must exceed the thickness of the entire PIC, including the substrate layer. The frequency response of communication between a PIC and PCB arranged this way is therefore limited by the minimum total thickness of the PIC.

BRIEF SUMMARY

According to an aspect of the disclosure, a PIC chip including a grating coupler may be mounted to a PCB such that a wafer side of the PIC chip faces the PCB. The grating coupler may include a taper portion and grating features. The grating features may be configured to direct an optic signal received from an optic cable onto a waveguide layer within the wafer, or to direct an optic signal received from the waveguide layer out to an optic cable. The grating features may extend from the taper portion toward a substrate of the chip. The grating features may include two distinct layers, and one of the two distinct layers may be located nearer to the substrate than the taper portion.

According to another aspect, a photonic integrated circuit (PIC) chip may comprise a substrate, a wafer on the substrate, and a grating coupler within the wafer including a taper portion and grating, the grating extending toward the substrate from the taper portion.

In some arrangements, the wafer may comprise an insulator layer adjacent to the substrate, a waveguide layer adjacent to the insulator layer, and a cladding on an opposite side of the waveguide layer from the insulator layer.

In some arrangements, the taper portion may be located in the cladding.

In some arrangements, the coupler may be configured to transition a light path between the taper portion and the waveguide layer.

In some arrangements, the grating may not extend into the cladding.

In some arrangements, the grating may comprise grating features in two distinct layers, with a first layer of the grating features being nearer to the substrate than the taper portion.

In some arrangements, the grating may extend into the insulator layer.

In some arrangements, the grating may extend from the waveguide layer to the substrate.

In some arrangements, the grating may include ribs extending through an entire thickness of the insulator layer.

In another aspect, a signal conveying assembly may comprise a PIC chip, comprising a substrate, a wafer on the substrate, and a grating coupler within the wafer including a taper portion and grating. The grating may extend toward the substrate from the taper portion. The signal conveying assembly may also comprise a printed circuit board (PCB) to which the PIC chip is mounted such that a wafer side of the PIC chip faces the PCB.

In some arrangements, the signal conveying assembly may comprise electrical contacts patterned on a cladding layer of the wafer located furthest from the substrate, the contacts establishing electric communication between the chip and the PCB.

In some arrangements, the signal conveying assembly may define a light path along which optical signals may enter or exit the PIC chip that is incident on a side of the grating coupler corresponding to a side of the taper portion from which the grating extends.

In another aspect, a method of constructing a portion of a photonic integrated circuit may comprise depositing a substrate, depositing an insulator layer on the substrate, depositing a waveguide layer on the insulator layer, forming a first layer of grating features in either of the insulator layer or the waveguide layer, and forming a taper portion of a grating coupler further from the substrate than the first layer of grating features.

In some arrangements, formation of the first layer of grating features may comprise etching a pattern in the insulator layer and filling the pattern with material before depositing the waveguide layer.

In some arrangements, formation of the first layer of grating features may comprise depositing and etching a layer of material on the substrate before depositing the insulator layer.

In some arrangements, formation of the first layer of grating features may further include etching a pattern in the insulator layer after the insulator layer has been deposited and filling the pattern with material.

In some arrangements, formation of the taper portion may include deposition of material on top of the waveguide layer.

In some arrangements, the method may comprise depositing a cladding on the waveguide layer such that the taper portion is situated within the cladding.

In some arrangements, the method may comprise formation of features in the taper portion and waveguide layer for transitioning a photonic signal between the taper portion and the waveguide layer.

In some arrangements, the method may comprise depositing a cladding on the waveguide layer, patterning electrical contacts on the cladding, and mounting a chip provided by the substrate, insulator layer, waveguide layer, and cladding to a PCB such that the cladding faces the PCB.

DETAILED DESCRIPTION

Figure 1A:
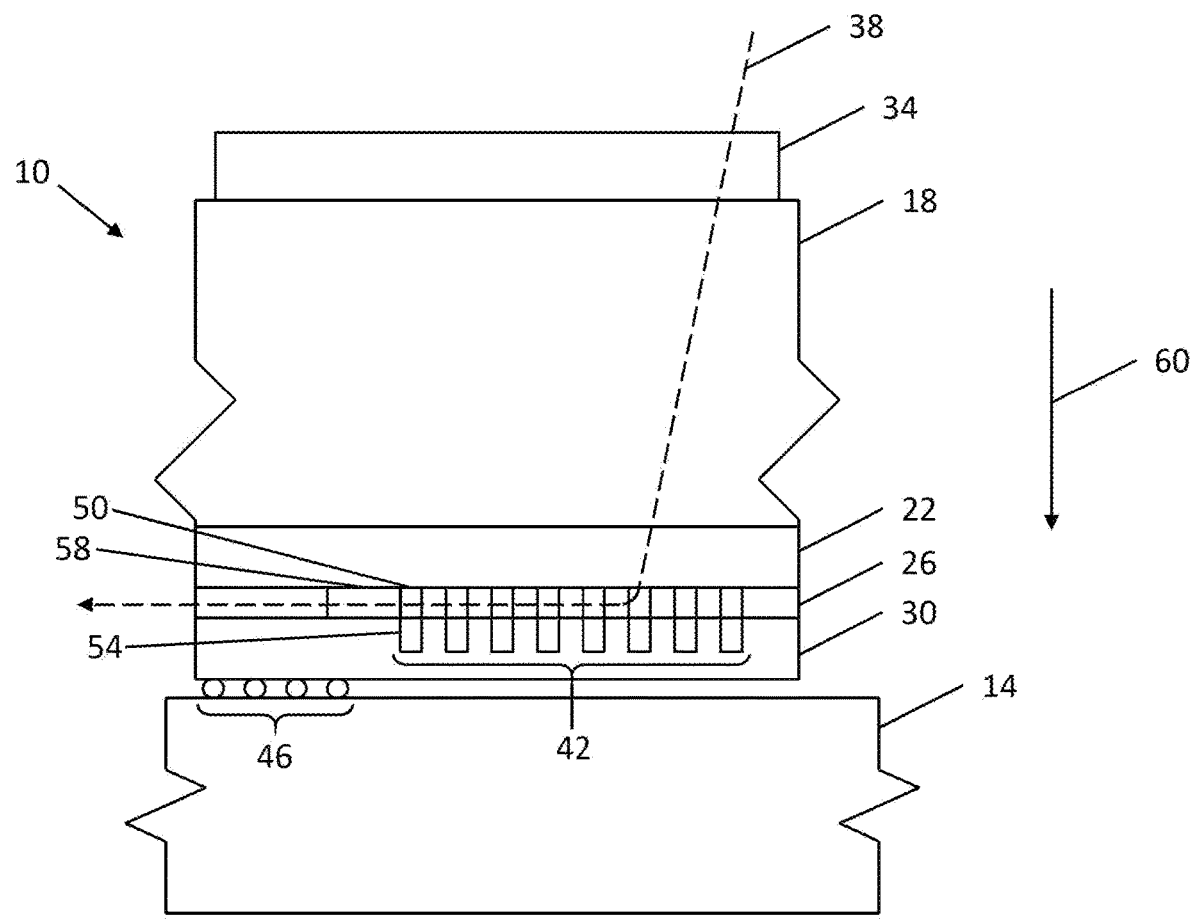
FIG. 1A is a side elevation view of a PIC chip according to a first aspect of the disclosure.
Figure 1B:
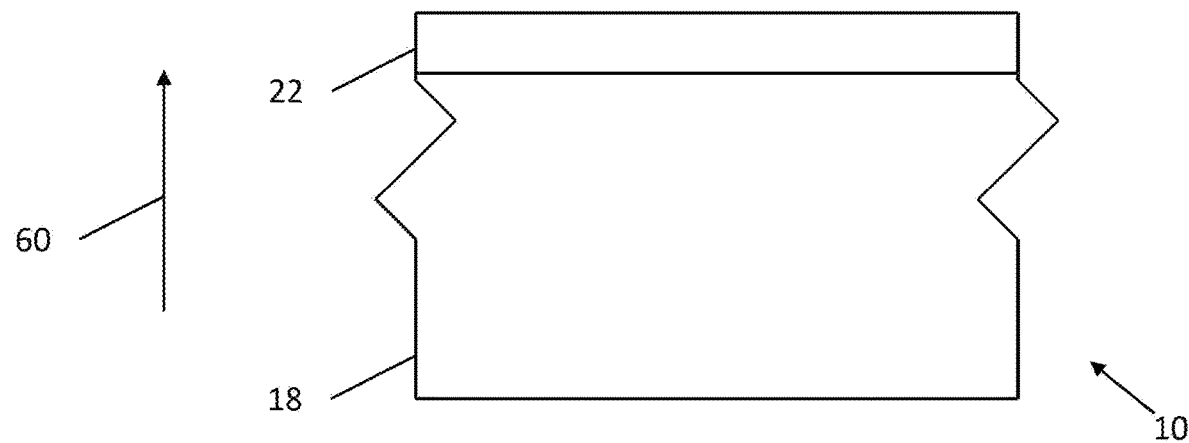
FIGS. 1B-1E illustrate stages in a process for manufacturing the chip of FIG. 1A.
Figure 1C:
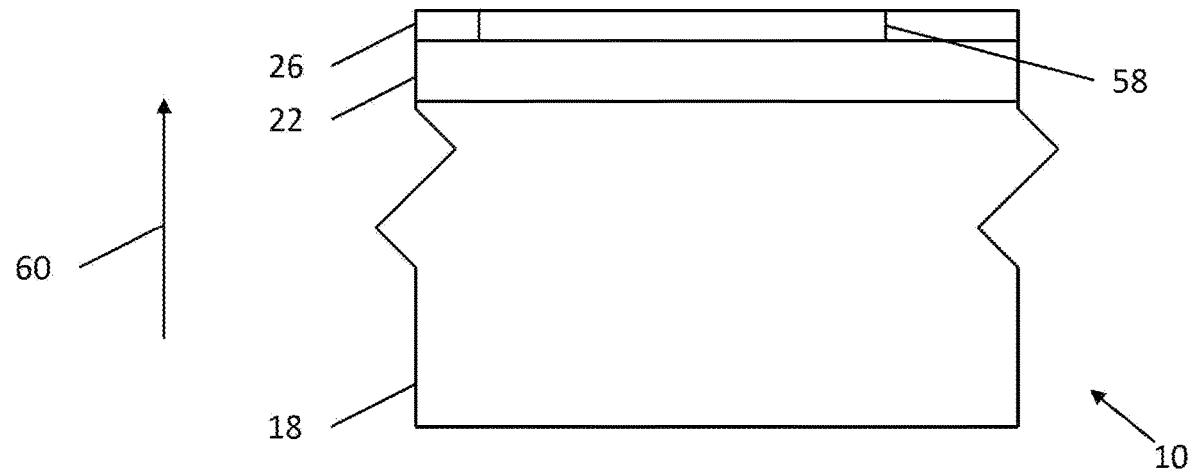
Figure 1D:
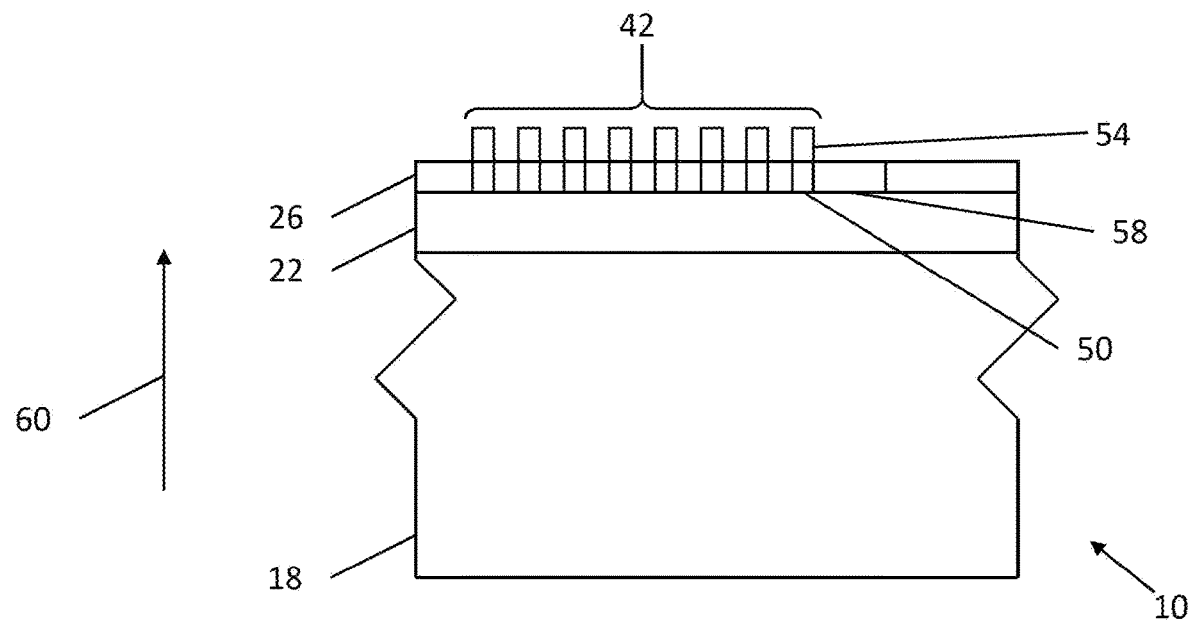
Figure 1E:
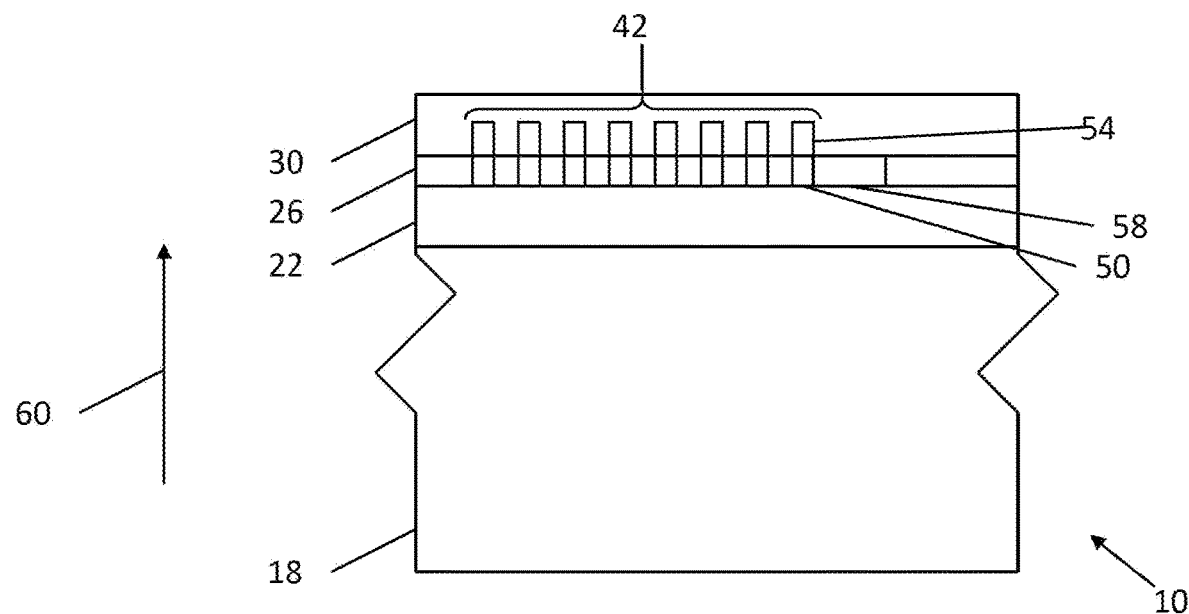

A flip-chip arrangement of a PIC chip 10 on a PCB 14 is shown in FIG. 1. The chip 10 includes, in order of increasing proximity to the PCB 14, a substrate 18, a buried oxide, or insulator layer 22, a waveguide layer 26, and cladding 30. The substrate 18, insulator layer 22, waveguide layer 26, and cladding 30 may be made of any appropriate materials known for use in photonic circuits. For example, the substrate 18 may be silicon and the insulator layer 22 and cladding 30 may be silica. The waveguide layer 26, including a taper portion 58, may be either silicon alone or a combination of silicon and silica. The cladding 30 may include additional materials, such as metals or other reflective materials, suspended in or layered on the silicon dioxide. In further examples, the cladding 30 may be one or more distinct dielectric layers. In other examples, the substrate 18, insulator layer 22, waveguide layer 26, and cladding 40 may be made from any of a variety of other materials. Suitable compositions include groups of materials of varying transparency such that optical signals can be sent into or out of the chip 10 through the substrate 18 and insulator 22 or confined to the waveguide layer 26 at different locations on the chip 10.

A coupling material 34 lies on an opposite side of the substrate 14 from the insulator layer 22, waveguide layer 26, and cladding 30. The coupling material 34 is an optical medium that functions to connect an optic cable, which is not illustrated, to the chip 10. Light may propagate between the optic cable and PIC along a light path 38 that extends through the coupling material 34 with little loss. The light path 38 continues from the coupling material 34 through the substrate 18 and insulator layer 22 to the grating section 42, which redirects the light path 38 along the waveguide layer 26.

Communication between the chip 10 and the PCB 14 occurs through electrical contacts 46 patterned on the cladding 30, such as solder bumps, metal pads, or short wirebonds. The illustrated examples are shown and described in an application wherein optical signals received by the chip 10 are converted to electrical signals that are communicated to the PCB 14 through the contacts 46. However, the principles of the present disclosure are generally reversible, such that the same structures illustrated and described herein may be used in applications where the chip 10 receives electrical signals from the PCB 14 through the contacts 46, converts the electrical signals to optical signals, and communicates the optical signals out to the optic cable.

The orientation of the chip 10 shown in FIG. 1A, with the wafer side facing the PCB 14, means the contacts 46 can be relatively short. Specifically, the contacts 46 can be shorter elements than those that would be necessary to establish communication between the wafer side of the chip 10 and the PCB 14 if the wafer side of the chip 10 faced away from the PCB 14. As a result, the contacts 46 can have relatively low inductance, allowing for a faster frequency response than could be achieved with longer elements.

The light path 38 travels through the substrate 18 to reach the grating 42, which extends from an opposite side of the waveguide layer 26 from the substrate 18. The incidence of the light path 38 on the coupler provided by the grating 42 and taper portion 58 therefore differs from typical known grating coupler arrangements, wherein the light path 38 reaches or exits the coupler from a side of the waveguide layer 26 on which the grating features 50, 54 are located. As such, effective design of the architecture of the chip 10 shown in FIG. 1 in many applications requires derivation of new shapes, sizes, and spacing of the grating features 50, 54.

The grating 42 is formed of materials patterned in the waveguide layer 26 and cladding 30. In the illustrated examples, the waveguide side grating features 50 and cladding side grating features 54 are both ribs of material differing from the material or materials that otherwise make up the layer corresponding to the respective side of the grating 42 and discontinuous from adjacent layers. In other examples, the grating 42 is provided by either or both of waveguide layer 26 material extending into an adjacent layer in the wafer and material of an adjacent layer in the wafer extending into the waveguide layer. Waveguide side grating features 50 may be, for example, silicon dioxide, and cladding side grating features 54 may be, for example, polysilicon. Elements of the grating 42 are spaced and dimensioned as necessary to redirect the light path 38 onto the waveguide layer 26 from the angle of incidence at which light is received from the optic cable. The grating 42 cooperates with a horn or taper section 58 in the waveguide layer 22. Spacing and relative sizing of features in the grating 42 depends on the application, and may be any combination or pattern of spacing and sizing effective to redirect the light path 38 between the waveguide layer 26 and the incidence of the light path 38 to or from the optic cable. Even sizing and spacing is depicted in FIGS. 1-5 for ease of illustration only, and arrangements of uneven spacing and sizing are contemplated in combination with any other features described herein.

The chip 10 is illustrated in FIG. 1A that a stack direction 60, defined by the direction in which layers accumulate in a process for manufacturing the chip 10, is oriented downward. In such a process, the substrate 14 is provided as the bottom layer. The insulator layer 22, waveguide layer 26, and cladding 30, collectively referred to as the wafer, are deposited in order on top of the substrate 14, as shown in FIGS. 1B-1E. Grating 42 or other waveguide features may be provided with etching steps between deposition steps. With specific reference to FIGS. 1C and 1D, a pattern may be etched into the waveguide layer 26 before the cladding 30 is deposited. Material may be deposited to fill the pattern etched in the waveguide layer 26, and any overfill may be etched away, to provide the taper portion 58. Another pattern may be etched into the taper portion 58 and filled with another material to waveguide side grating features 50. In other examples, the taper portion 58 may be deposited and etched after the waveguide side grating features 50 are deposited and etched, and before the remainder of the waveguide layer 26 is deposited. Another layer of material may be deposited and etched to provide the cladding side grating features 54, which may then be covered by deposition of the cladding 30. Grating 42 features are therefore produced in two distinct layers in the process illustrated in FIGS. 1B-1E.

The grating 42 in the illustrated example redirects received signals "downward," or in a direction that is closer to opposite of the stack direction 60 of the chip 10. To do so, the grating 46 is designed to account for refraction of light along the light path 38 as it passes through the coupling medium 34, substrate 14, and insulator layer 18 between the grating 42 and optic cable. Reference to the stack direction 60 here is for purposes of orientation only, and the PIC chips described and illustrated herein may be manufactured in any way.

Multiple architectures are capable of redirection of the light path 38 downward relative to the stack direction 60. Specific examples are provided by further arrangements described below. In the various arrangements, like numerals refer to like elements, such as numerals 18, 118, 218, etc. each referring to a substrate, unless noted otherwise.

Figure 2A:
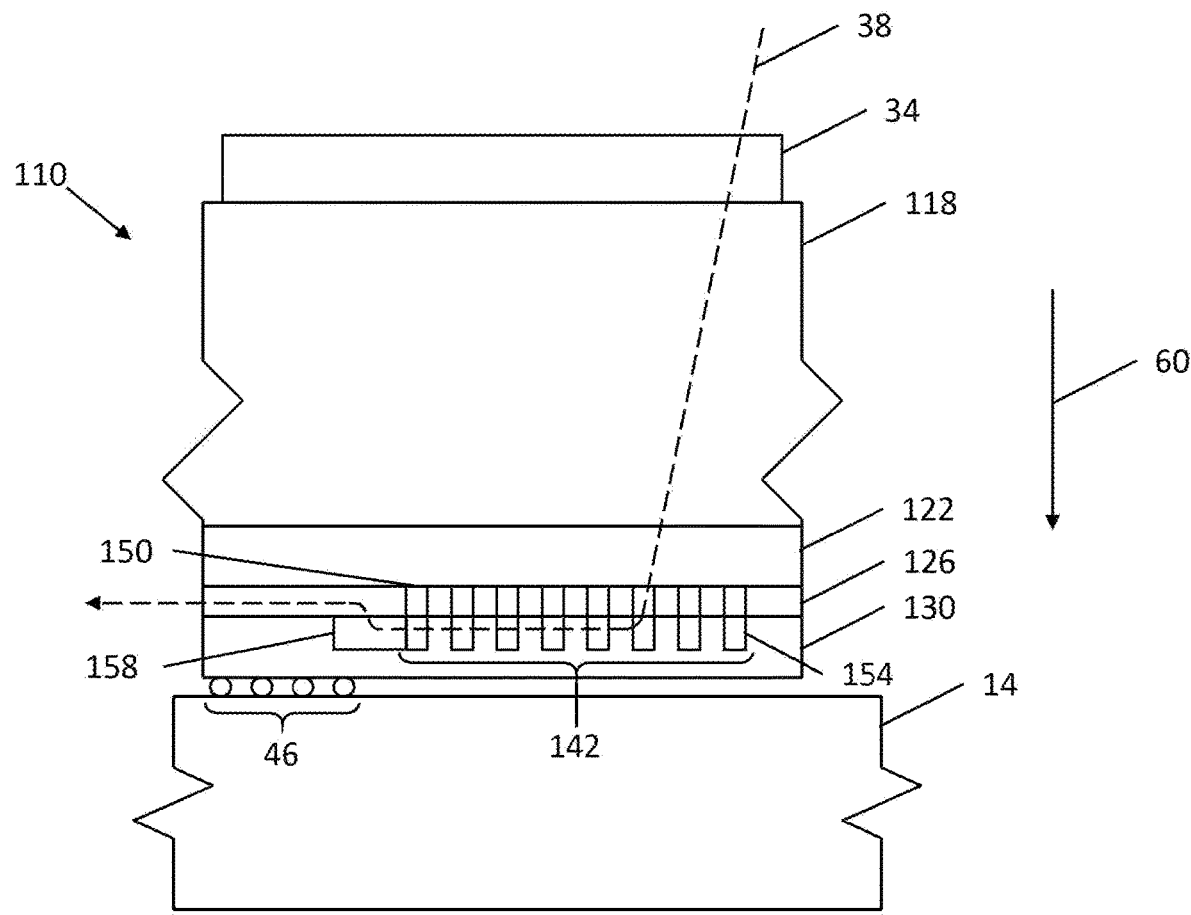
FIG. 2A is a side elevation view of a PIC chip according to a second aspect of the disclosure.

A chip 110 according to another example arrangement is shown arranged on the PCB 14 in FIG. 2A. In the chip 110, a taper portion 158 or horn is in the cladding 130 instead of the waveguide layer 126. The grating 142 therefore extends toward the substrate 114, or downward relative to the stack direction 60, from the taper portion 156. The grating 142 permits the light path 38 to travel into the cladding 130 and to extend along the cladding 130 into the taper portion 158. The taper portion 158 directs the light path 38 back into the waveguide layer 126 at a narrow end of the taper portion 158. The light path 38 is therefore incident on the side of the taper portion 158 on which the grating features 150, 156 are located.

Figure 2B:
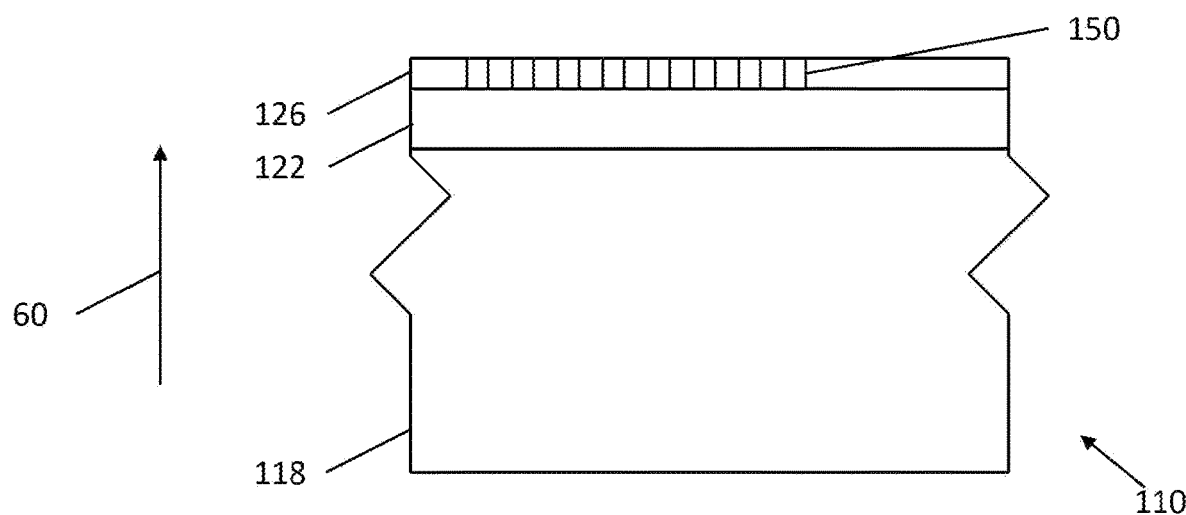
FIGS. 2B and 2C illustrate stages in a process for manufacturing the chip of FIG. 2A.
Figure 2C:
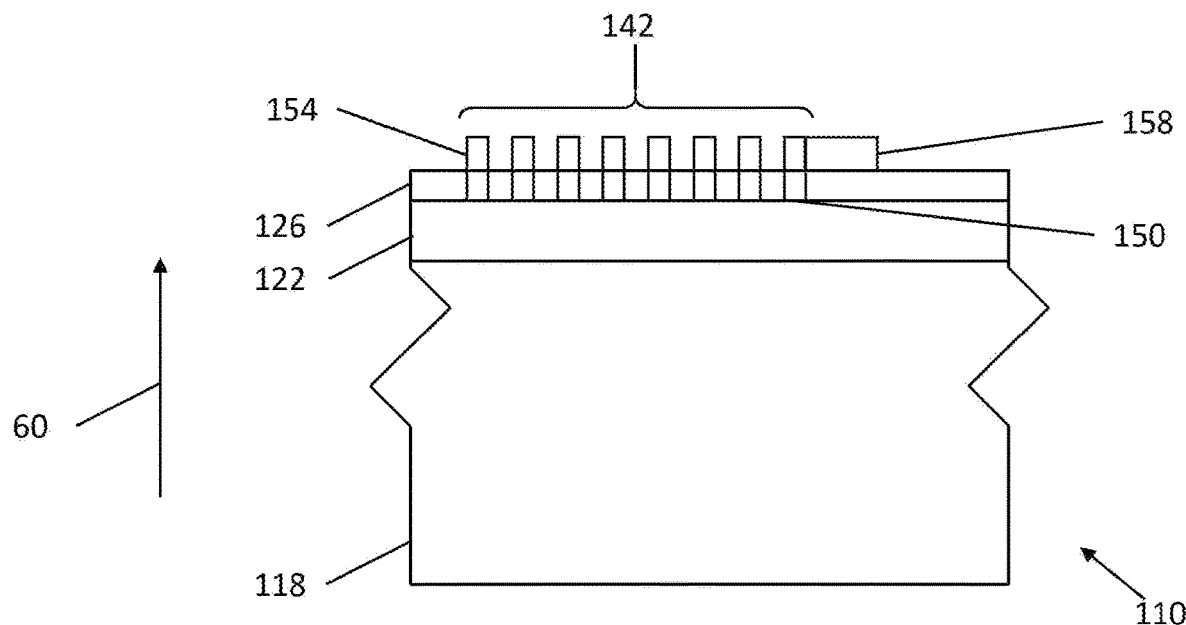

During manufacture of the chip 110, a pattern is etched into the waveguide layer 126 and filled to create the waveguide side grating features 150 as shown in FIG. 2B. Similar to the cladding side grating features 154, the taper portion 158 is created by depositing and etching a layer of material before the cladding 130 is deposited as shown in FIG. 2C. In the chip 110, a first layer of grating 142 features, referring to the waveguide side grating features 150, are deposited before, and closer to the substrate, than the taper portion 158.

Figure 3A:
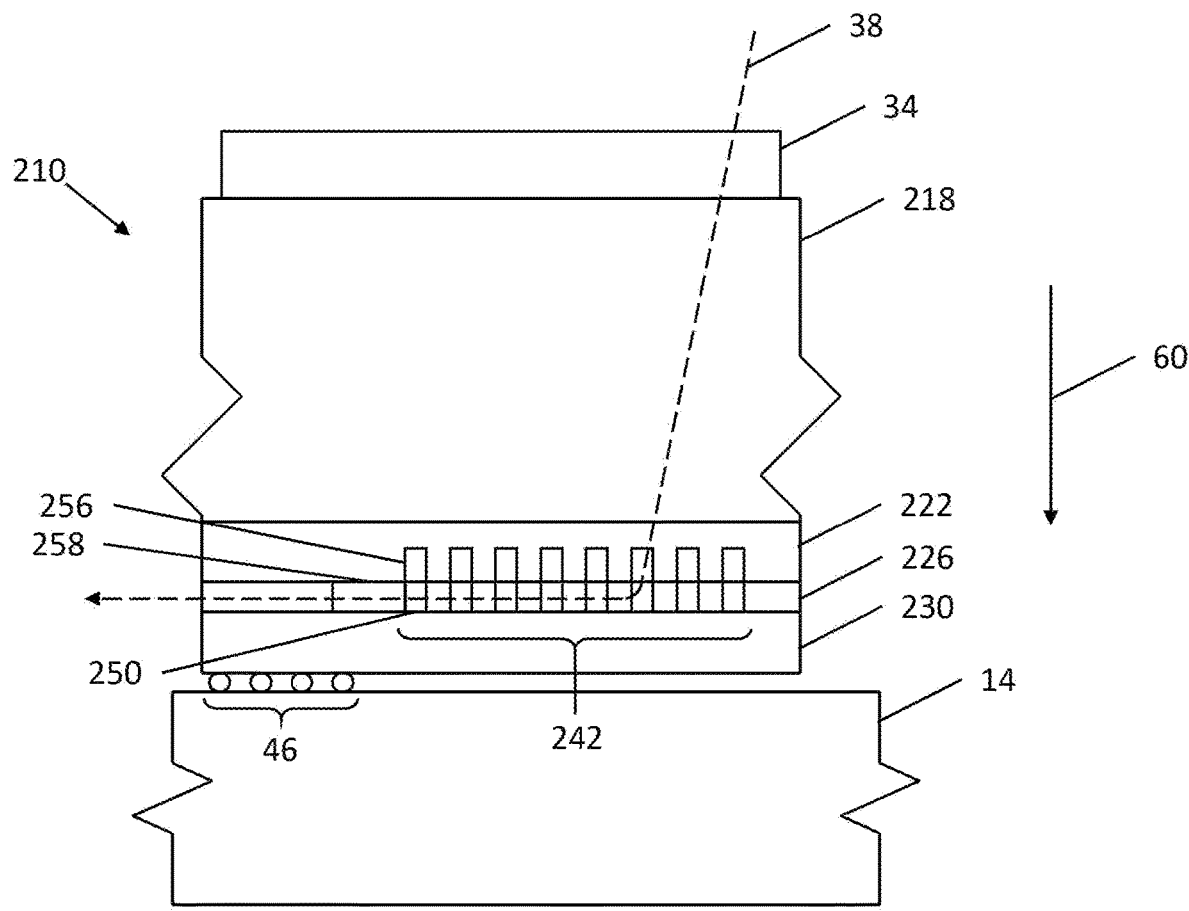
FIG. 3A is a side elevation view of a PIC chip according to a third aspect of the disclosure.

A chip 210 according to another alternative arrangement is shown arranged on the PCB 14 in FIG. 3A. The grating 242 extends downward relative to the stack direction 60 from the waveguide layer 226 and taper portion 258 and into the insulator layer 222. The grating 242 therefore does not extend into the cladding 230. Instead of cladding side features, the grating 242 includes insulator side grating features 256, which may be, for example, polysilicon. Similar to the chip 110 of FIG. 2A, the chip 210 of FIG. 3A is oriented such that the light path 38 is incident on a side of the grating coupler corresponding to a side of the taper portion 258 on which the grating features 250, 256 are located.

Figure 3B:
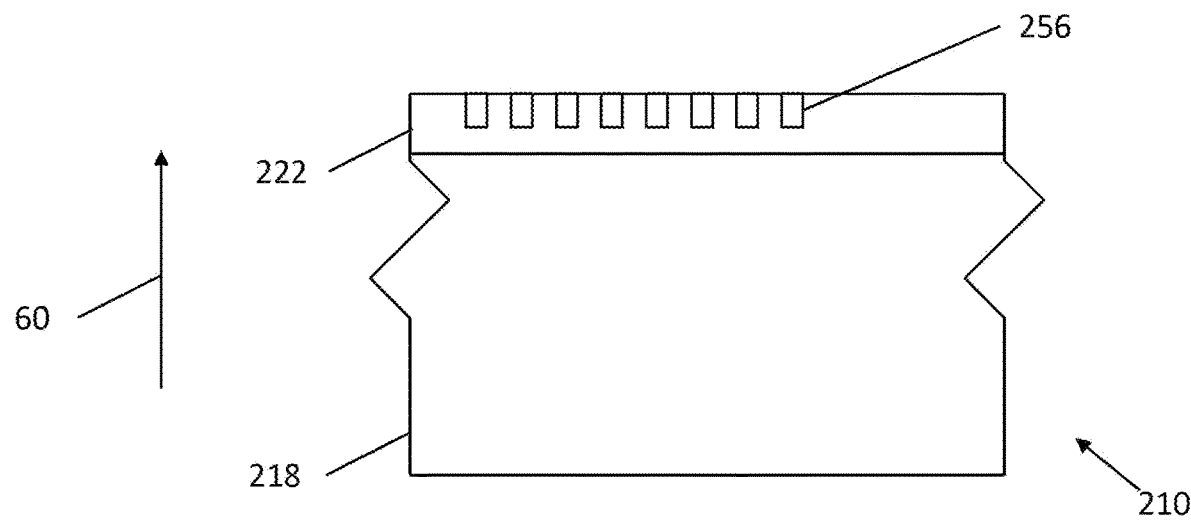
FIGS. 3B and 3C illustrate stages in a process for manufacturing the chip of FIG. 3A.
Figure 3C:
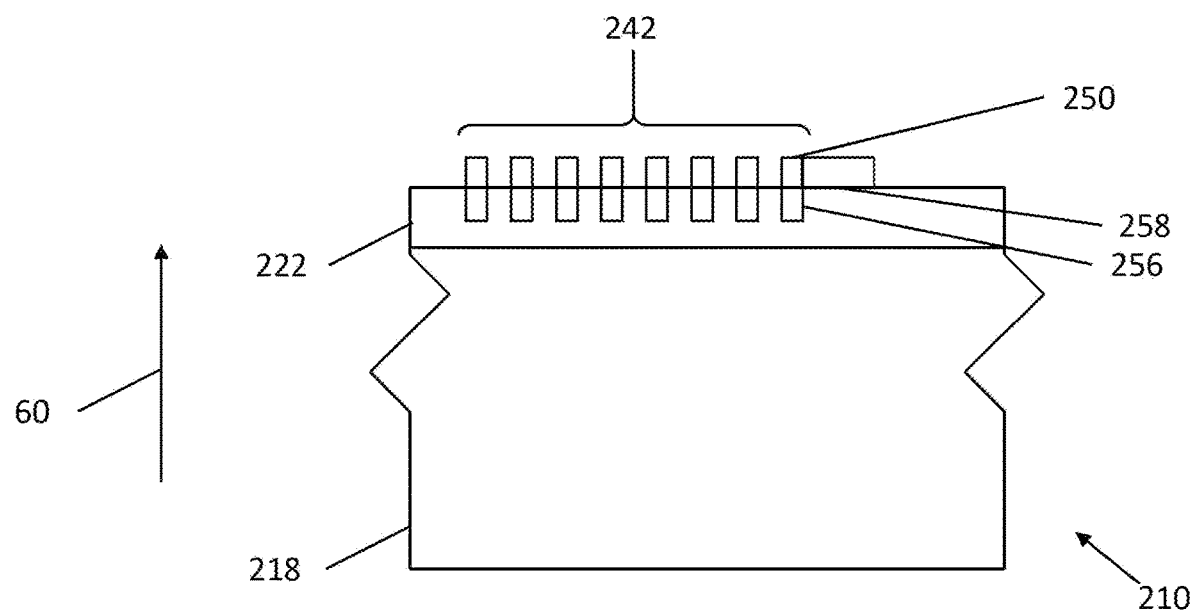

During manufacture of the chip 210, prior to deposition of the waveguide layer 226, a pattern is etched into the insulator layer 226 and filled to provide a first layer of grating 242 features, referring to the insulator side grating features 256, as shown in FIG. 3B. Turning to FIG. 3C, the insulator side grating features 256 are therefore deposited and etched and followed by the taper portion 258 and waveguide side grating features 250 before the waveguide layer 226 or any other features at the same elevation as the waveguide layer 226 is deposited. In other examples, the waveguide layer 226 is deposited immediately following creation of the insulator side grating features 256, and patterns are etched into the waveguide layer 226 and filled to provide the taper portion 258 and the waveguide side grating features 250.

Figure 4A:
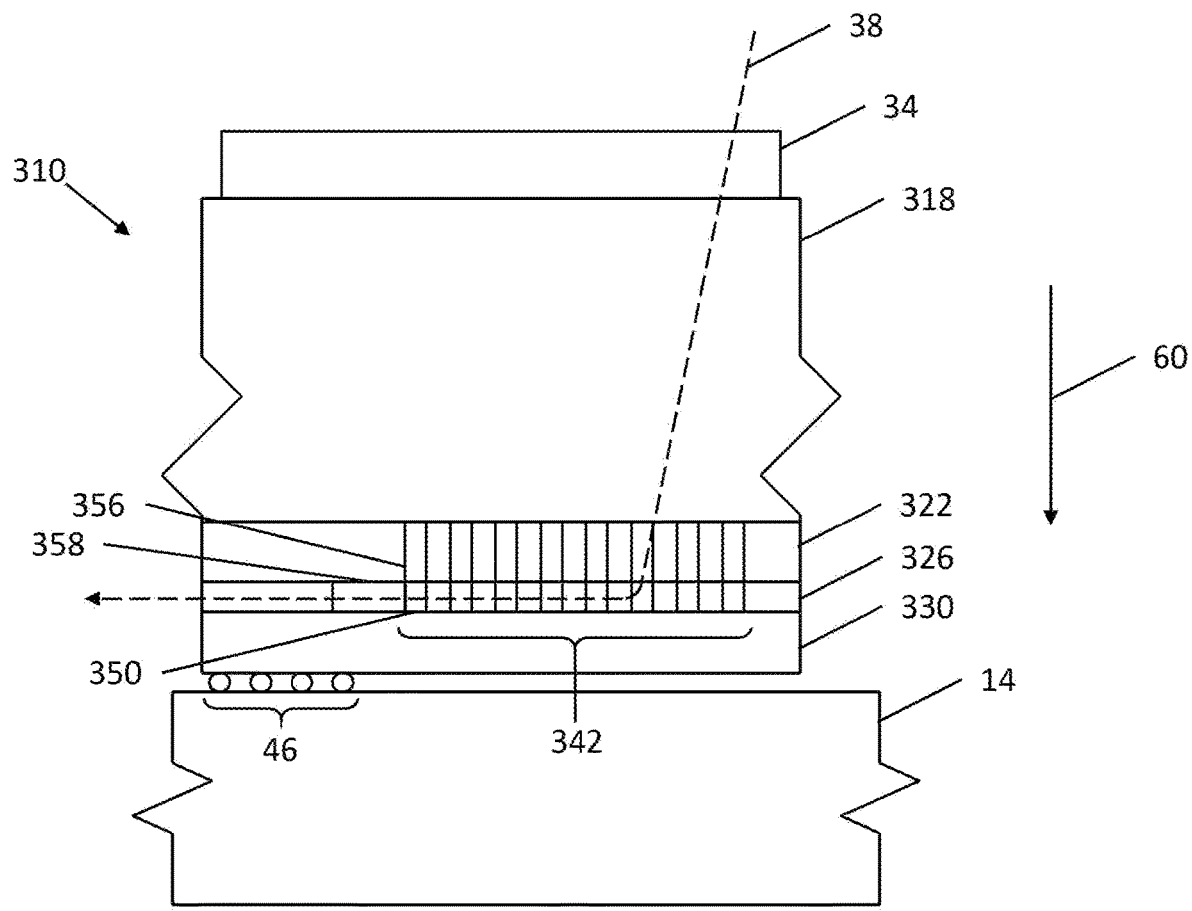
FIG. 4A is a side elevation view of a PIC chip according to a fourth aspect of the disclosure.
Figure 4B:
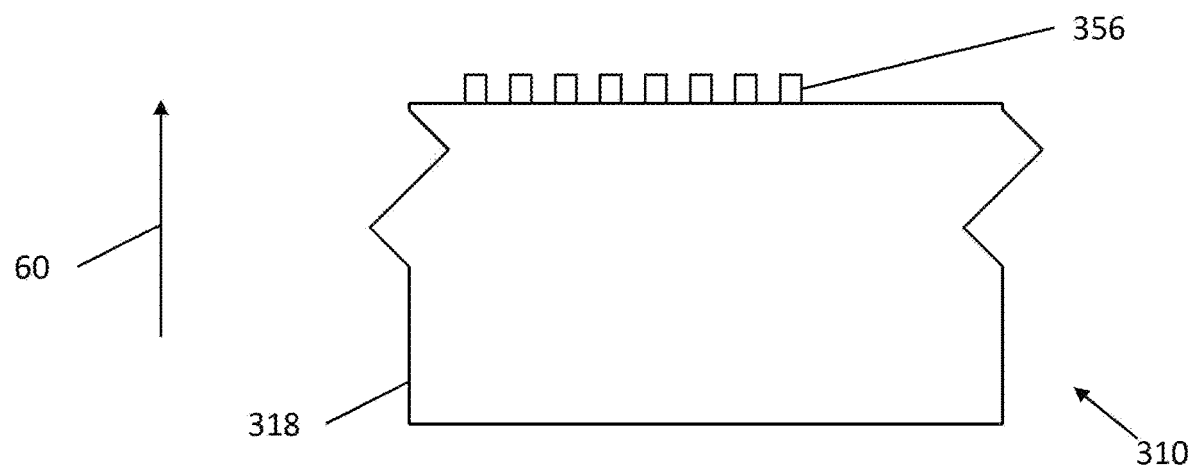
FIGS. 4B-4E illustrate stages in a process for manufacturing the chip of FIG. 4A.

A chip 310 according to another alternative arrangement is shown arranged on the PCB 14 in FIG. 4A. Insulator side grating features 356 of the grating 342 in the chip 310 extend through an entire thickness of the insulator layer 326 from the waveguide layer 326 to the substrate 314. Similar to the chips 110, 210 of FIGS. 2A and 3A, the chip 310 of FIG. 4A is oriented such that the light path 38 is incident on a side of the grating coupler corresponding to a side of the taper portion 358 on which the grating features 350, 356 are located.

Figure 4C:
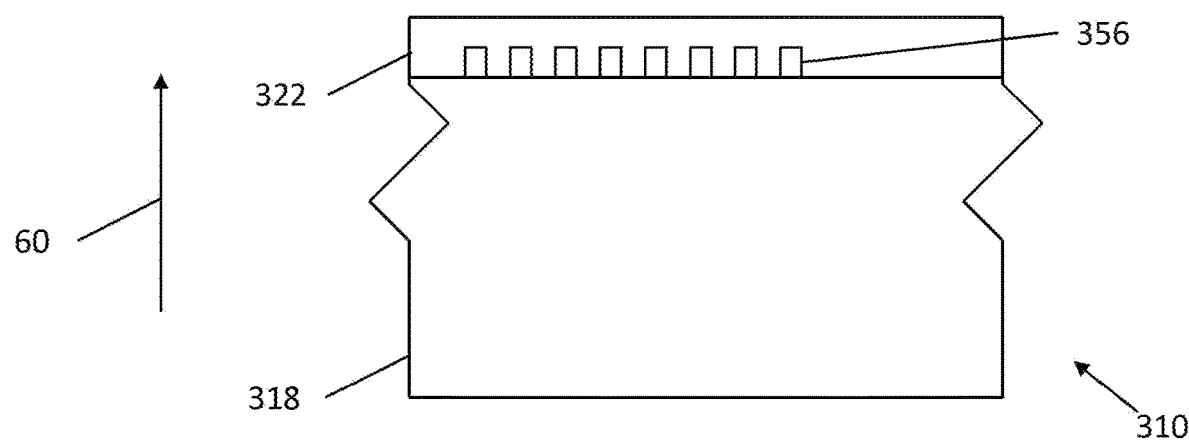
Figure 4D:
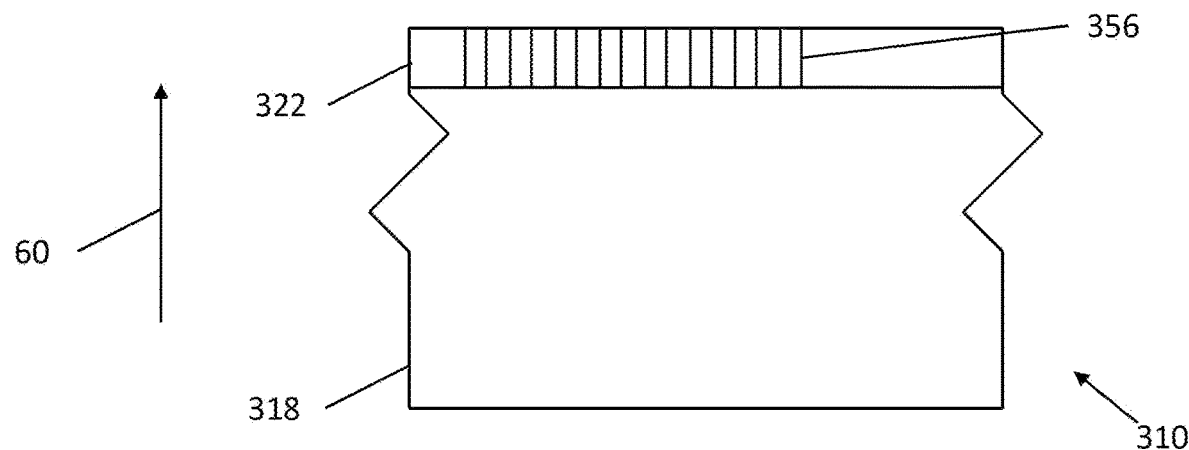
Figure 4E:
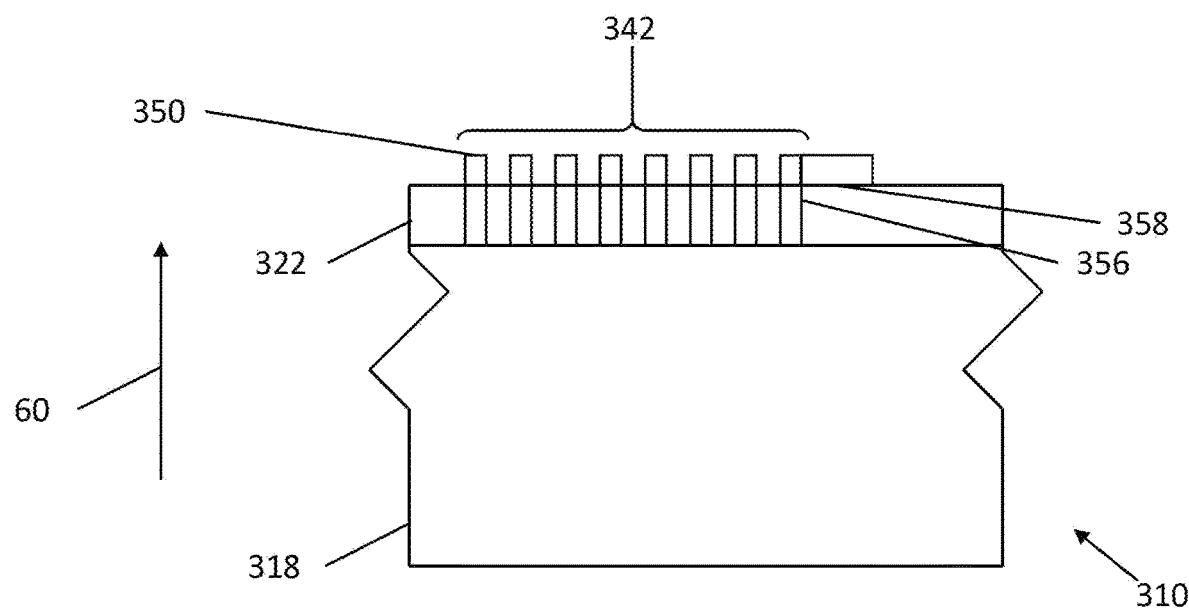

The insulator side grating features 356 may be produced by steps performed before, after, or both before and after deposition of the insulator layer 322. In a step shown in FIG. 4B preceding deposition of the insulator layer 322, material, such as polysilicon, for the insulator side grating features 356 may be deposited on the substrate 314 and etched into an intended pattern before the insulator layer 322 is deposited. The insulator layer 322 may then be deposited over the beginnings of the insulator side grating features 356 as shown in FIG. 4C. Alternatively, or in addition, a pattern may be etched into the insulator layer 322 and filled with material for the insulator side grating features 356 after the insulator layer 322 has been deposited to result in grating features 356 extending through the insulator layer 322 as shown in FIG. 4D. Whether the insulator side grating feature 356 can be deposited in a single step depends on their design and size. Depositing a first portion of the design side grating features 356 before depositing the insulator layer 322, then etching a pattern into the insulator layer 322 and filling the pattern with a second portion of the design side grating features 356, enables designs for the insulator side grating features 356 that could not be deposited and etched as a single layer. In any case, as shown in FIG. 4E, the waveguide side grating features 350 and taper portion 358 are deposited and etched on top of the insulator layer 322, and therefore further from the substrate 318 than the insulator side grating features 356.

Figure 5:
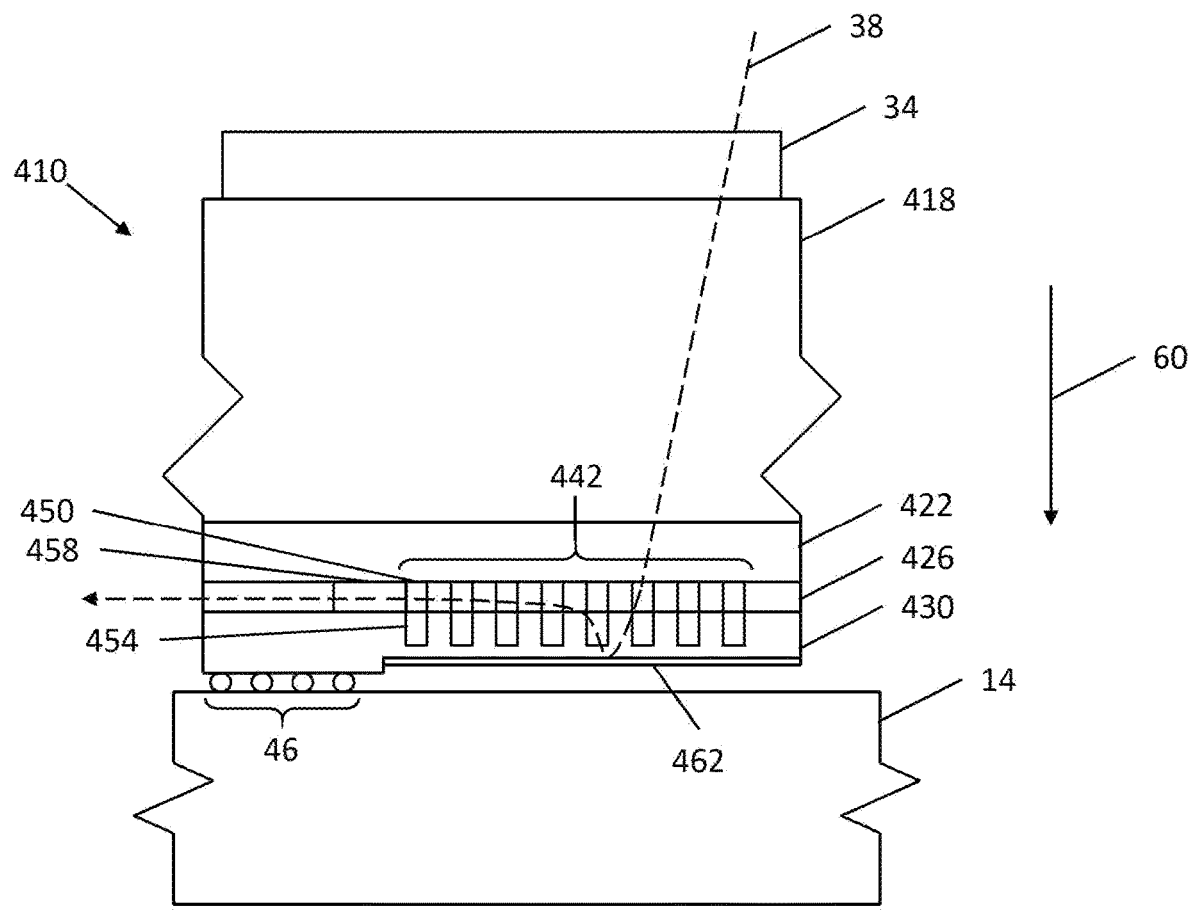
FIG. 5 is a side elevation view of a PIC chip according to a fifth aspect of the disclosure.

A chip 410 according to another example arrangement is shown arranged on the PCB 14 in FIG. 5. In the chip 410, a reflective coating 462, such as a layer of metal, is placed on the cladding 430 opposite the waveguide layer 426 and grating 442. After the cladding 430 is deposited, part of the cladding 430 may be etched away to produce a portion of reduced thickness and the reflective coating 462 may be deposited on the etched surface of the cladding 430. The reflective coating 462 may be etched away from most of the cladding 430 to leave only the reflective coating 462 located on the portion of the cladding 430 of reduced thickness. Cladding 430 material may then be deposited over the reflective element 462, though this is not illustrated in FIG. 5. By reflecting the light path 38 from the topside of the chip 410 onto the taper portion 458 through the cladding side grating features 454, the arrangement shown in FIG. 4A makes the light path 38 incident on the grating coupler from a side of the taper portion 458 on which the grating features 450, 454 are located.

The reflective coating 462 is located on the cladding 430 relative to the light path 438 and grating 442 such that incoming signals along the light path 430 will be reflected onto the grating 442, and signals directed onto the reflective coating 462 from the grating 442 will be reflected out along the light path 438. In the illustrated arrangement, the foregoing interaction between the light path 438, grating 442, and reflective coating 462 is accomplished by directing the light path 438 around the grating 442 on its way into or out of the chip 410. When a signal enters the chip 410 along the light path 438, it travels to the reflective coating 462 without crossing the grating 442, and the reflective coating 462 directs the incoming signal to the grating 442, which then orients the signal along the waveguide layer 426. Similarly, if the light path 438 were reversed, an outgoing signal along the waveguide layer 426 would be directed by the grating 442 onto the reflective layer 462, which would then direct the signal out through the substrate 414 without crossing the grating 442 a second time. In alternative arrangements, the chip 410 is configured such that the light path 438 crosses the grating 442 twice. In such arrangements, the grating 442 directing the signal onto the reflective layer 462 in the first instance, and the reflective layer 462 directs the signal toward another portion of the grating 442, which finally directs the signal either onto the waveguide layer 426 or out of the chip 410 through the substrate 414 depending on the direction of the signal.

The architectures shown in FIGS. 2A-5 all enable the light path 38 to enter or exit the respective PIC chip from the side of the grating coupler on which the grating features are located. Because grating couplers have previously been designed with grating features facing the topside of a chip, from which a light path enters or exits, similar grating designs to those of previous grating couplers may be used in the arrangements of FIGS. 2A-5.

It should be understood that any of the above described features for redirecting the light path 38 "upward," or away from the wafer side of a PIC, may be combined in a single chip if appropriate for a given application. Such combinations may be configured for an intended redirection of the light path 38 by through proper design of the grating in view of the implemented features.

Although the subject matter herein has been described with reference to particular examples, it is to be understood that these examples are merely illustrative of the principles and applications. It is therefore to be understood that numerous modifications may be made to the illustrative examples and that other arrangements may be devised without departing from the spirit and scope of the subject matter as defined by the appended claims.

The invention claimed is:

1. A signal conveying assembly comprising:
a photonic integrated circuit (PIC) chip, comprising:
a substrate;
a wafer on the substrate comprising a cladding layer located furthest from the substrate; and
a grating coupler within the wafer including a taper portion and grating, the grating extending toward the substrate from the taper portion; and
a printed circuit board (PCB) to which the PIC chip is mounted such that a wafer side of the PIC chip faces the PCB; and
electrical contacts patterned on the cladding layer, the electrical contacts establishing electric communication between the PIC chip and the PCB.

2. The signal conveying assembly of claim 1, wherein the grating is of material differing from the materials of a layer in the wafer corresponding to a respective side of the grating and discontinuous from adjacent layers.

3. The signal conveying assembly of claim 1, wherein the wafer comprises:
an insulator layer adjacent to the substrate;
a waveguide layer adjacent to the insulator layer; and
the cladding layer on an opposite side of the waveguide layer from the insulator layer.

4. The signal conveying assembly of claim 3, wherein the taper portion is located in the cladding layer.

5. The signal conveying assembly of claim 3, wherein the grating coupler is configured to transition a light path between the taper portion and the waveguide layer.

6. The signal conveying assembly of claim 3, wherein the grating does not extend into the cladding layer from the taper portion.

7. The signal conveying assembly of claim 3, wherein the grating includes grating features in two distinct layers, with a first layer of the grating features being nearer to the substrate than the taper portion.

8. The signal conveying assembly of claim 3, wherein the grating extends into the insulator layer from the taper portion.

9. The signal conveying assembly of claim 8, wherein the grating extends from the waveguide layer to the substrate.

10. The signal conveying assembly of claim 9, wherein the grating includes ribs extending through an entire thickness of the insulator layer.

11. A signal conveying assembly comprising:
a photonic integrated circuit (PIC) chip, comprising:
a substrate;
a wafer on the substrate, the wafer comprising:
an insulator layer adjacent to the substrate;
a waveguide layer adjacent to the insulator layer; and
a cladding layer on an opposite side of the waveguide layer from the insulator layer; and
a grating coupler within the wafer including a taper portion and grating, the grating extending toward the substrate from the taper portion; and
a printed circuit board (PCB) to which the PIC chip is mounted such that a wafer side of the PIC chip faces the PCB.

12. The signal conveying assembly of claim 11, defining a light path along which optical signals may enter or exit the PIC chip that is incident on a side of the grating coupler corresponding to a side of the taper portion from which the grating extends.

* * * * *